United States Patent
Wu

(10) Patent No.: US 8,183,849 B2
(45) Date of Patent: May 22, 2012

(54) CALIBRATION APPARATUS AND CALIBRATION METHOD THEREOF

(75) Inventor: Chia-Hsin Wu, Taipei County (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 469 days.

(21) Appl. No.: 12/464,114

(22) Filed: May 12, 2009

(65) Prior Publication Data

US 2010/0289462 A1 Nov. 18, 2010

(51) Int. Cl.
*G05F 3/08* (2006.01)
*G01R 35/04* (2006.01)

(52) U.S. Cl. .................. 323/314; 324/601

(58) Field of Classification Search .......... 702/85, 702/87, 88, 107; 324/601; 323/313–316
See application file for complete search history.

(56) References Cited

U.S. PATENT DOCUMENTS

| | | | |
|---|---|---|---|
| 6,075,407 A * | 6/2000 | Doyle | 327/539 |
| 6,586,964 B1 * | 7/2003 | Kent et al. | 326/30 |
| 6,885,958 B2 | 4/2005 | Yaklin | |
| 6,897,714 B2 * | 5/2005 | Mori | 327/541 |
| 6,968,167 B1 | 11/2005 | Wu | |
| 6,983,135 B1 | 1/2006 | Tsai | |
| 7,453,252 B1 * | 11/2008 | Megaw | 323/313 |
| 7,962,116 B1 * | 6/2011 | Tsai et al. | 455/326 |

OTHER PUBLICATIONS

Kuan-Hua Chao et al., Title of Invention: Differential Driver With Calibration Circuit and Related Calibration Method, U.S. Appl. No. 12/940,033, filed Nov. 4, 2010.

* cited by examiner

*Primary Examiner* — Gary L Laxton
(74) *Attorney, Agent, or Firm* — Winston Hsu; Scott Margo

(57) ABSTRACT

A calibration apparatus includes: a first circuit arranged for generating a reference voltage with respect to a first circuit element according to a reference current flowing to the first circuit element, a second circuit arranged for generating an output voltage according to a tunable current, and an adjusting circuit coupled to the first circuit and the second circuit for adjusting the tunable current to a target current value according to the reference voltage and the output voltage.

18 Claims, 9 Drawing Sheets

US 8,183,849 B2

CALIBRATION APPARATUS AND CALIBRATION METHOD THEREOF

BACKGROUND

The present invention relates to a calibration apparatus and calibration method thereof, and more particularly to a calibration apparatus that calibrates a current of a current generator to obtain a deviation of a passive element in the integrated circuit and a method thereof.

Passive elements, such as resistors and capacitors, are critical elements in an integrated circuit. For example, a reference current can be generated by coupling an internal resistor having a resistance R to the output of a bandgap reference circuit, in which the output voltage of the bandgap reference circuit is Vbg. Therefore, the reference current of Vbg/R is obtained. However, the process variation may cause a large deviation upon the internal resistor and consequently vary the required current value of the reference current. In addition, an internal capacitor can be utilized for implementing a filter in the integrated circuit. In other words, the accuracy of the passive element may greatly influence the function of the integrated circuit. Therefore, a mechanism is required to acquire the deviation of passive elements in the integrated circuit.

SUMMARY OF THE INVENTION

According to a first embodiment of the present invention, a calibration apparatus is disclosed. The calibration apparatus comprises a first circuit, a second circuit, and an adjusting circuit. The first circuit is arranged for generating a reference voltage with respect to a first circuit element according to a reference current flowing to the first circuit element. The second circuit is arranged for generating an output voltage according to a tunable current. The adjusting circuit is coupled to the first circuit and the second circuit for adjusting the tunable current to a target current value according to the reference voltage and the output voltage of the second circuit.

According to a second embodiment of the present invention, a calibration method is disclosed. The calibration method comprises the following steps: generating a reference voltage with respect to a first circuit element according to a reference current flowing to the first circuit element; generating an output voltage according to a tunable current; and adjusting the tunable current to a target current value according to the reference voltage and the output voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
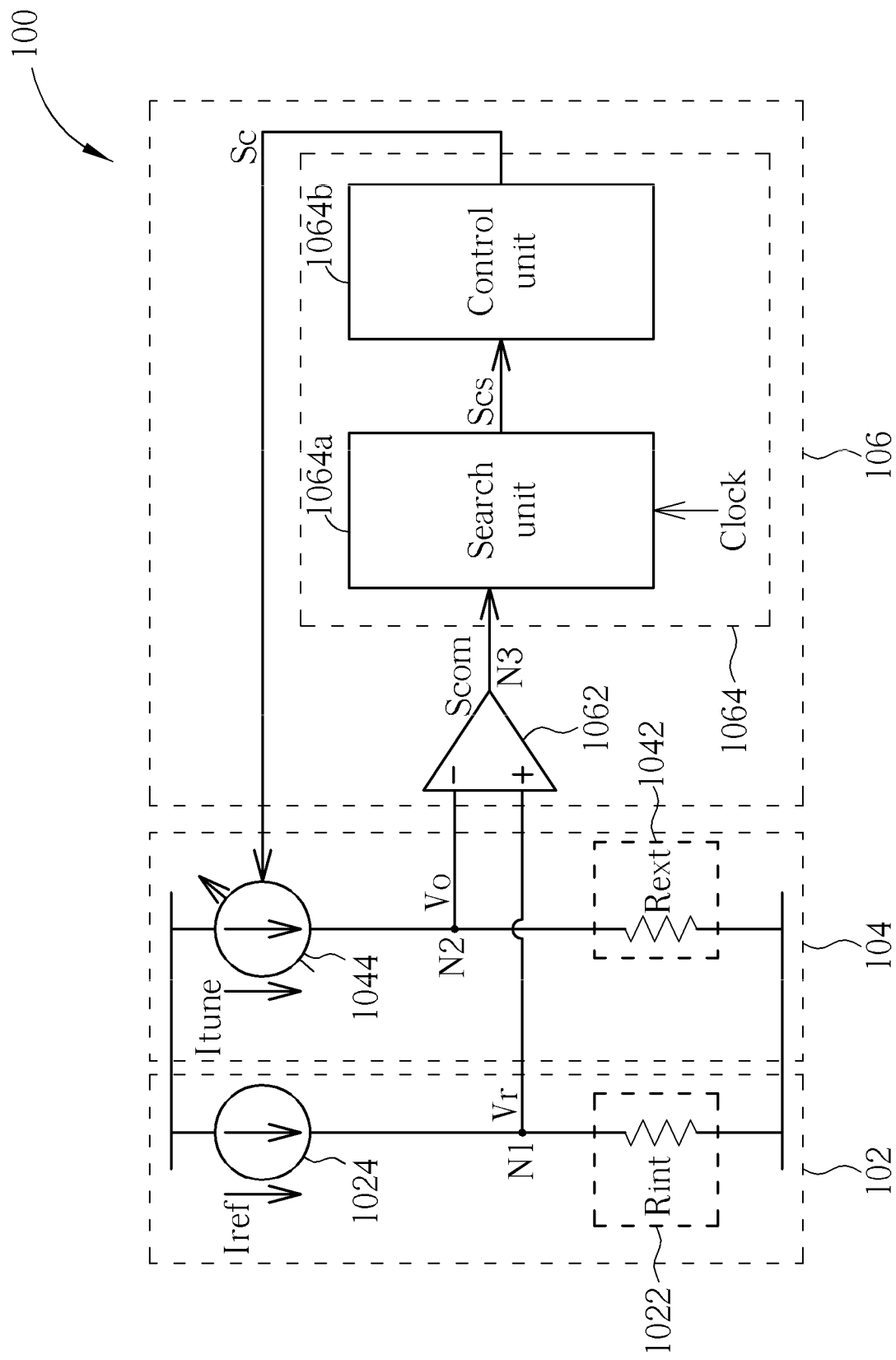
FIG. 1 is a diagram illustrating a calibration apparatus according to a first embodiment of the present invention.

Please refer to FIG. 1. FIG. 1 is a diagram illustrating a calibration apparatus 100 according to an embodiment of the present invention. The calibration apparatus 100 comprises a first circuit 102, a second circuit 104, and an adjusting circuit 106. Furthermore, the first circuit 102 comprises a first circuit element 1022 and a reference current generator 1024. The second circuit 104 comprises a second circuit element 1042 and a tunable current generator 1044. According to the embodiment of the present invention, the first circuit element 1022 is an internal resistor Rint having a resistance of $r_{int}$ disposed in an integrated circuit (IC), and the second circuit element 1042 is an external resistor Rext having a resistance of $r_{ext}$ not disposed in the IC. In other words, except for the second circuit element 1042, the first circuit 102, the tunable current generator 1044, and the adjusting circuit 106 are configured as the integrated circuit (IC).

The first circuit 102 is arranged for generating a reference voltage Vr with respect to the internal resistor Rint of the first circuit element 1022 according to a reference current Iref flowing to the internal resistor Rint of the first circuit element 1022. The second circuit 104 is arranged for generating an output voltage Vo with respect to the external resistor Rext of the second circuit element 1042 according to the tunable current Itune flowing to the external resistor Rext of the second circuit element 1042. The adjusting circuit 106 is coupled to the first circuit 102 and the second circuit 104 for adjusting the tunable current Itune to a target current value Itar according to the reference voltage Vr and the output voltage Vo. According to the embodiment of the present invention, the reference current Iref is a current proportional to absolute temperature (PTAT), but this is not meant to be a limitation of the present invention.

The reference current generator 1024 is coupled to the first circuit element 1022 at a first node N1 to generate the reference current Iref to the first circuit element 1022, thereby inducing the reference voltage Vr at the first node N1 that is further coupled to the adjusting circuit 106. The tunable current generator 1044 is coupled to the second circuit element 1042 at a second node N2. The tunable current generator 1044 generates the tunable current Itune to the second circuit element 1042 according to a control signal Sc, which comprises four control bits S[3], S[2], S[1], S[0] in this embodiment (although this is not a limitation of the present invention) generated from the adjusting circuit 106, thereby inducing the output voltage Vo at the second node N2 that is further coupled to the adjusting circuit 106.

The adjusting circuit 106 comprises a comparator 1062 and a controlling module 1064. The comparator 1062 has a first input terminal (i.e., positive terminal (+)) coupled to the first node N1, a second input terminal (i.e., negative terminal (−)) coupled to the second node N2, and an output terminal N3, and the comparator 1062 is arranged for comparing the reference voltage Vr and the output voltage Vo to generate a comparison result Scom at the output terminal N3. The controlling module 1064 is coupled to the output terminal N3 of the comparator 1062 and the tunable current generator 1044 for generating the control signal Sc according to the comparison result Scom, wherein the tunable current generator 1044 adjusts the tunable current Itune in response to the control signal Sc. The controlling module 1064 comprises a search unit 1064a and a control unit 1064b. The search unit 1064a is coupled to the comparator 1062 for performing a binary search operation according to the comparison result Scom to thereby determine a control setting Scs. In addition, a clock signal CLOCK is coupled to the search unit 1064a. The control unit 1064b is coupled to the search unit 1064a for generating the control signal Sc according to the control setting Scs.

Figure 2:
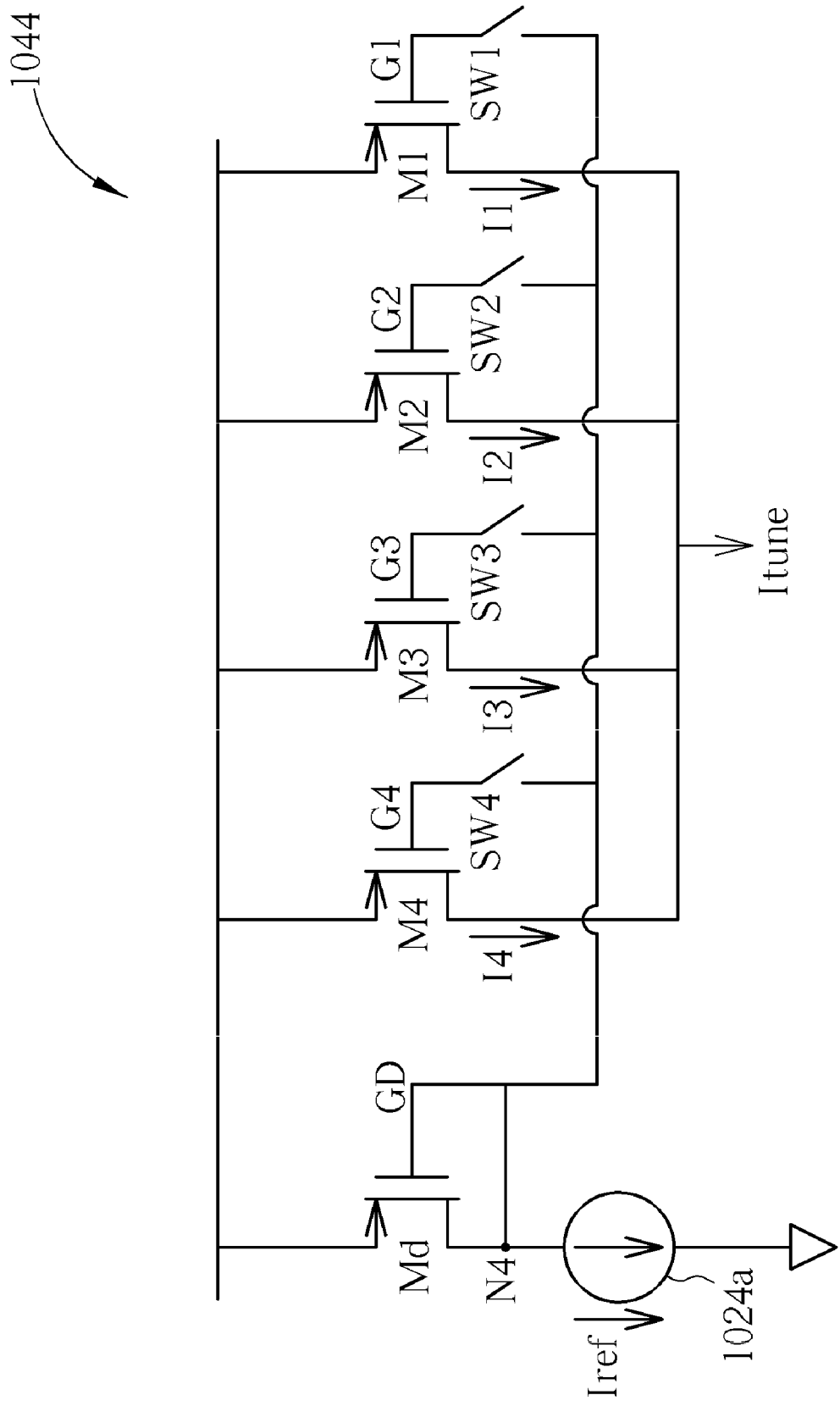
FIG. 2 is a diagram illustrating a tunable current generator as shown in FIG. 1 according to an embodiment of the present invention.

In addition, the tunable current generator 1044 comprises a reference current source 1024a, a diode-connected transistor Md, and a plurality of mirroring transistors M1-M4 as shown in FIG. 2. FIG. 2 is a diagram illustrating the tunable current generator 1044 as shown in FIG. 1 according to an embodiment of the present invention. The reference current source 1024a generates the reference current Iref for the diode-connected transistor Md. The diode-connected transistor Md has a connecting terminal N4 coupled to the reference current source Iref. The plurality of mirroring transistors M1-M4 are arranged to mirror the reference current Iref to generate a plurality of mirroring currents I1-I4, respectively. The plurality of switches SW1-SW4 are respectively coupled between a plurality of control terminals G1-G4 of the plurality of mirroring transistors M1-M4 and a control terminal GD of the diode-connected transistor Md, wherein each of the plurality of switches SW1-SW4 is controlled by the control signal Sc, i.e., S[0], S[1], S[2], S[3], respectively, to selectively enable a corresponding mirroring transistor to generate a mirroring current, i.e., the tunable current Itune, to an output node, i.e., the second node N2, of the tunable current generator 1044. Furthermore, according to the embodiment of the present invention, the sizes i.e., width-length ratio, of each of the mirroring transistors M1-M4 increase by the power of 2, i.e., the size of the mirroring transistor M1 is W/L, the size of the mirroring transistor M2 is 2*(W/L), the size of the mirroring transistor M3 is 4*(W/L), and the size of the mirroring transistor M4 is 8*(W/L), but this is not meant to be a limitation of the present invention. Therefore, according to the embodiment of the present invention, the value of the tunable current Itune can be N*Iref, where N is an integer number from 1 to 16 determined by the four control bits S[3], S[2], S[1], S[0] of the control signal Sc. For example, if only the switch SW2 is turned on by the second bit S[1] of the control signal Sc, i.e., the control signal Sc is 0010, then the tunable current Itune is 2*Iref. In other words, S[3] can be viewed as the most significant bit of the control signal Sc, and S[0] can be viewed as the least significant bit of the control signal Sc.

In view of the above-mentioned conventional reference current generating method, the reference current Iref of the reference current generator 1024 is originally generated by a bandgap reference circuit in combination with another internal resistor (not shown) in the integrated circuit, wherein the internal resistor can be designed to have a resistance approximately equal to the resistance of the internal resistor Rint, i.e., $r_{int}$, and this is well-known by those skilled in the art, thus the detailed description is omitted here for brevity. Furthermore, the reference current Iref can be mirrored or duplicated to the reference current source 1024a for generating the reference current Iref to the diode-connected transistor Md as shown in FIG. 2. The reference current Iref is $V_{bg}/r_{int}$, wherein $V_{bg}$ is the output voltage generated by the bandgap reference circuit. When the reference current Iref flows to the internal resistor Rint, the reference voltage Vr having a voltage level of $V_{bg}$ can be obtained, as stated in the following equation (1):

$$Vr = Iref * r_{int} = (V_{bg}/r_{int}) * r_{int} = V_{bg}. \quad (1)$$

On the other hand, when the tunable current Itune flows to the external resistor Rext, the output voltage Vo is:

$$Vo = Itune * r_{ext}, \quad (2)$$

wherein $r_{ext}$ is the resistance of the external resistor Rext. Then, the adjusting circuit 106 adjusts the tunable current Itune to the target current value Itar of M*(Iref) to equal the reference voltage Vr and the output voltage Vo, wherein M is the current ratio between the reference current Iref and the tunable current Itune when the output voltage Vo is equal to the reference voltage Vr, and M is the magnitude of the four control bits S[3], S[2], S[1], S[0] of the control signal Sc. Therefore, when the output voltage Vo is equal to the reference voltage Vr:

$$(V_{bg}/r_{int}) * r_{int} = M*(Iref) = M*(V_{bg}/r_{int}) * r_{ext},$$

$$=> r_{int} = M * r_{ext},$$

$$=> (V_{bg}/r_{int}) * M = (V_{bg}/r_{ext}). \quad (3)$$

According to the equation (3), the target current value Itar, which is equal to $V_{bg}/r_{ext}$, is uncorrelated to the resistance $r_{int}$ of the internal resistor Rint. In other words, no matter how serious the process variation that occurs to the internal resistor Rint, the target current value Itar can be fixed at a known current $V_{bg}/r_{ext}$ through the adjusting of the control signal Sc. Furthermore, since the output voltage $V_{bg}$ generated by the bandgap reference circuit, the integer number M, and the resistance $r_{ext}$ of the external resistor Rext are known values, the resistance $r_{int}$ of the internal resistor Rint can be derived by the above-mentioned equation (3). Then, a further calibration upon the internal resistor Rint can be proceed. The detailed description is omitted here for brevity.

Figure 3:
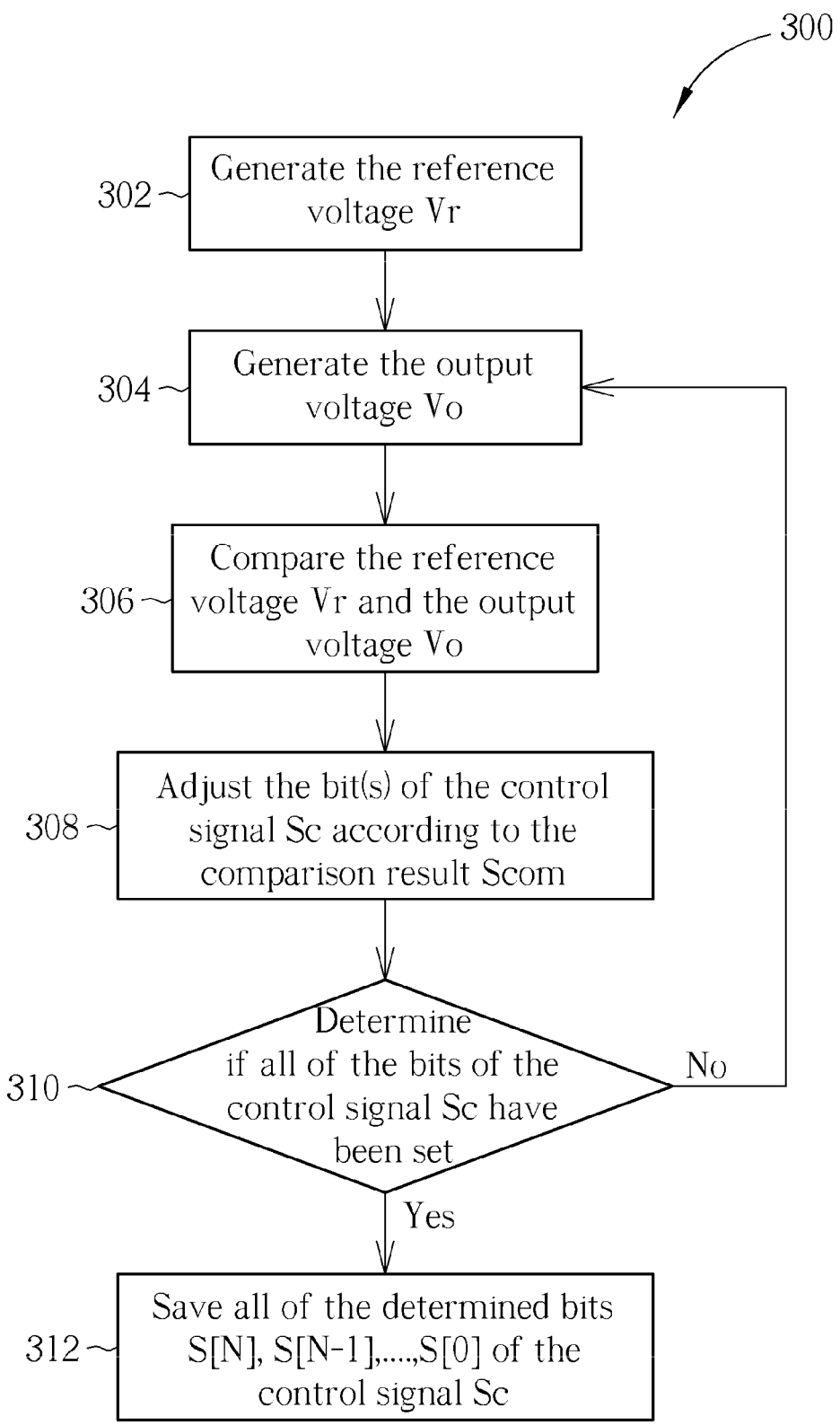
FIG. 3 is a flow chart illustrating a calibration method according to a second embodiment of the present invention.

Please refer to FIG. 3. FIG. 3 is a flow chart illustrating a calibration method 300 according to a second embodiment of the present invention. In order to describe the spirit of the calibration method 300 more clearly, the calibration method 300 of the embodiment is described in conjunction with the calibration apparatus 100 of FIG. 1 and the tunable current generator 1044 of FIG. 2. Furthermore, provided that substantially the same result is achieved, the steps of the flowchart shown in FIG. 3 need not be in the exact order shown and need not be contiguous, that is, other steps can be intermediate.

The calibration method 300 comprises:
step 302: generate the reference current Iref to flow to the internal resistor Rint to generate the reference voltage Vr;
step 304: generate the tunable current Itune according to the control signal Sc to generate the output voltage Vo;
step 306: compare the reference voltage Vr and the output voltage Vo to generate a comparison result Scom;

step 308: adjust the bit(s) of the control signal Sc according to the comparison result Scom, e.g., in the beginning, set the most significant bit of the control signal Sc into 1, i.e., S[N]=1, and the rest of the significant bits (less significant bits) as 0, i.e., S[N]=1, S[N-1]=0, . . . , S[0]=0, if the comparison result Scom shows that the reference voltage Vr is lower than the output voltage Vo, or set the most significant bit of the control signal Sc into 0 and the rest of the significant bits as 0 if the reference voltage Vr is higher than the output voltage Vo;

step 310: determine if all of the bits of the control signal Sc have been set, if yes, go to step 312, if no, use the current-adjusted bits to set the control signal Sc and go to step 304;

step 312: save all of the determined bits S[N], S[N-1], . . . , S[0] of the control signal Sc.

Please refer to FIG. 3 in conjunction with FIG. 1. When the calibration method 300 is activated, the reference current Iref is first generated by the bandgap reference circuit and the internal resistor as mentioned above. Then, the reference current Iref flows to the internal resistor Rint to generate the reference voltage Vr. Furthermore, the control unit 1064b generates the control signal Sc to initially set the tunable current Itune as half of the maximum current of the tunable current generator 1044. In this embodiment, the control signal Sc has four control bits S[3], S[2], S[1], S[0], i.e., N is equal to 3, S[3] represents the most significant bit of the control signal Sc, and S[0] represents the least significant bit of the control signal Sc. Therefore, in step 304, when the control unit 1064b sets the most significant bit of the control signal Sc as 1 and the rest of the significant bits (less significant bits) as 0, i.e., S[3]=1, S[2]=0, S[1]=0, S[0]=0, the tunable current Itune with half of the maximum current of the tunable current generator 1044 is generated. The tunable current Itune then flows to the external resistor Rext to generate the output voltage Vo in step 304. The comparator 1062 compares the reference voltage Vr and the output voltage Vo to generate a comparison result Scom at the output terminal N3 in step 306. Please note that, according to the embodiment of the present invention, the search unit 1064a detects the comparison result Scom from the comparator 1062 after the predetermined clock cycle, e.g., four clock cycles in this embodiment of the clock signal CLOCK. Then, in step 308, if the search unit 1064a determines that the comparison result Scom is high voltage level for example, and the search unit 1064a sets the most significant bit S[3] of the control signal Sc as 1. Otherwise, if the search unit 1064a determines that the comparison result Scom is low voltage level for example, then the search unit 1064a sets the most significant bit S[3] of the control signal Sc as 0.

When the most significant bit S[3] of the control signal Sc is determined and stored, the calibration method 300 then determines the next significant bit, i.e., S[2], of the control signal Sc. To do so, the search unit 1064a updates the bit number N of the control signal Sc by N-1. Accordingly, the most significant bit of the control signal is changed to S[N-1], i.e., S[2] in this embodiment. Then, in step 310, the search unit 1064a compares the updated bit number N with 0: if N is not smaller than 0, i.e. N≧0, the search unit 1064a sets the control bits of the control signal Sc as S[2], S[1], S[0], wherein S[2] represents the most significant bit of the control signal Sc, and S[0] represents the least significant bit of the control signal Sc. Then, similarly, the search unit 1064a sets the most significant bit of the control signal Sc into 1 and the rest of the significant bits as 0 (less significant bits), i.e., S[2]=1, S[1]=0, S[0]=0.

Then, the search unit 1064a outputs the control setting Scs to the control unit 1064b for outputting the control signal Sc having the four control bits S[3], S[2], S[1], S[0] to the tunable current generator 1044. Please note that the control unit 1064b loads the stored value of the S[3]: if the stored value of the S[3] is 1, the control signal Sc is 1100 at this time. Similarly, in step 304, the tunable current generator 1044 generates the tunable current Itune according to the new four control bits S[3], S[2], S[1], S[0] of the control signal Sc, i.e., 1100.

Then, the calibration method repeats the iteration from step 304 to step 310 until the search unit 1064a detects that the updated bit number N is smaller than 0, i.e. N<0. When N<0, this means that all of the control bits of the control signal Sc are determined. In this case, the calibration apparatus 100 saves all of the determined control bits S[N], S[N-1], . . . , S[0] of the control signal Sc (step 312). Then, the reference current Iref can be stopped.

According to the above mentioned binary search method, the above-mentioned current ratio M can be derived from the determined control bits S[N], S[N-1], . . . , S[0]. Furthermore, the tunable current Itune that corresponds to the determined control bits S[N], S[N-1], . . . , S[0] is the above-mentioned target current value Itar, i.e., $(V_{bg}/r_{int})*M$. According to the equation (3), i.e., $(V_{bg}/r_{int})*M=(V_{bg}/r_{ext})$, the resistance $r_{int}$ of the internal resistor Rint can be derived when the output voltage $V_{bg}$, the integer number M, and the resistance $r_{ext}$ of the external resistor Rext are known.

Please note that, in this embodiment, when the control bit of the control signal is high, i.e., 1, the corresponding switch is turned on to turn on the transistor. Otherwise, the transistor is turned off. For example, when the control unit 1064b outputs the control bit S[0]=1, the switch SW1 is turned on to couple the control terminal G1 of the mirroring transistor M1 to the control terminal GD of the diode-connected transistor Md.

By applying the calibration method 300 as shown in FIG. 3, the calibration apparatus 100 can also be utilized for calibrating a constant current, i.e., the reference current Iref is a constant current rather than a current proportional to absolute temperature (PTAT). Since the calibrating procedure of the constant current is similar to the above-mentioned PTAT current, the detailed description is omitted here for brevity.

Figure 4:
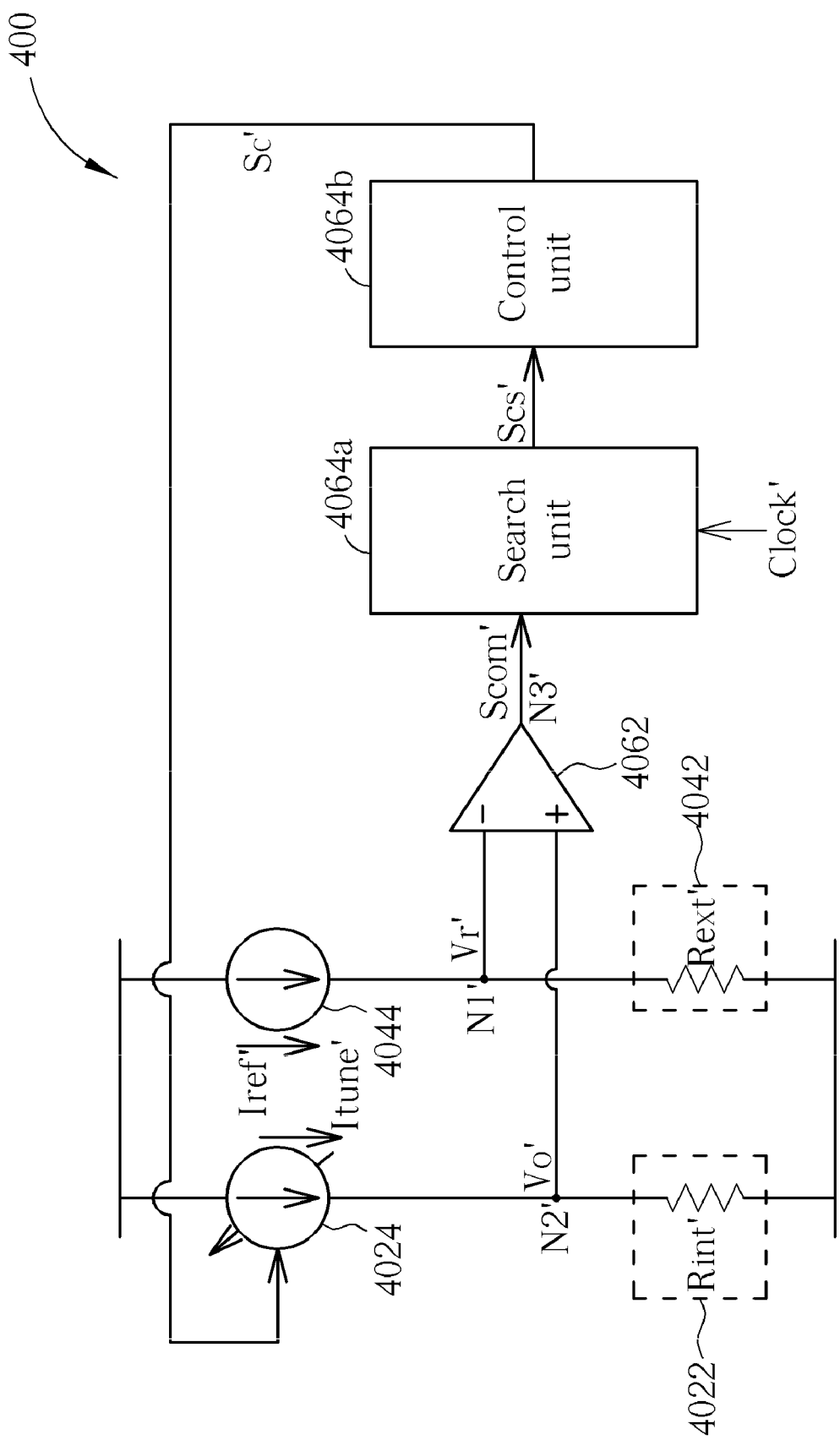
FIG. 4 is a diagram illustrating a calibration apparatus according to a third embodiment of the present invention.

Please refer to FIG. 4. FIG. 4 is a diagram illustrating a calibration apparatus 400 according to a third embodiment of the present invention. The calibration apparatus 400 comprises a first circuit element 4022, a tunable current generator 4024, a second circuit element 4042, a reference current generator 4044, a comparator 4062, a search unit 4064a, and a control unit 4064b. According to the embodiment of the present invention, the first circuit element 4022 is an internal resistor Rint' having a resistance of $r_{int}'$ disposed in an integrated circuit (IC), and the second circuit element 4042 is an external resistor Rext' having a resistance of $r_{ext}'$ not disposed in the IC. The tunable current generator 4024 provides a tunable current Itune' to the internal resistor Rint' to generate an output voltage Vo'. The reference current generator 4044 provides a reference current Iref' to the external resistor Rext' to generate a reference voltage Vr'. Similar to the first embodiment calibration apparatus 100, the comparator 4062 has a first input terminal (i.e., negative terminal (-)) coupled to the first node N1', a second input terminal (i.e., positive terminal (+)) coupled to the second node N2', and an output terminal N3', and the comparator 4062 is arranged for comparing the reference voltage Vr' and the output voltage Vo' to generate a comparison result Scom' at the output terminal N3'. The search unit 4064a is coupled to the comparator 4062 for performing a binary search operation according to the comparison result Scom' to thereby determine a control setting Scs'. In addition, a clock signal CLOCK' is coupled to the search unit 4064a. The control unit 4064b is coupled to the search unit 4064a for generating the control signal Sc' according to the control setting Scs' to adjust the tunable current Itune' to a target current value Itar'. In addition, the tunable current generator 4024 adjusts the tunable current Itune' in response to the control signal Sc'.

Compared to the first embodiment calibration apparatus 100, the reference voltage Vr' generated by the reference current generator 4044 and the external resistor Rext' is coupled to the negative terminal (−) of the comparator 4062, and the output voltage Vo' generated by the tunable current generator 4024 and the internal resistor Rint' is coupled to the positive terminal (+) of the comparator 4062. Then, by applying the second embodiment calibration method 300 of the present invention, the output voltage Vo' can be adjusted to equal the reference voltage Vr'. When the output voltage Vo' is equal to the reference voltage Vr':

$$(V_{bg}'/r_{int}')=(V_{bg}'/r_{ext}')*M'. \quad (4)$$

According to the equation (4), the target current value Itar', which is equal to $(V_{bg}'/r_{ext}')*M'$, is uncorrelated to the resistance $r_{int}$ of the internal resistor Rint. In other words, no matter how serious the process variation that occurs to the internal resistor Rint, the target current value Itar' can be fixed at a known current $(V_{bg}'/r_{ext}')*M'$ through the adjusting of the control signal Sc. Please note that the output voltage $V_{bg}'$ is generated by a bandgap reference circuit, and the integer number M' and the resistance $r_{ext}'$ of the external resistor Rext' are known values, thus the resistance $r_{int}'$ of the internal resistor Rint' can be derived by the above-mentioned equation (4). Then, a further calibration upon the internal resistor Rint' can be proceeded, and the detailed description is omitted here for brevity.

Figure 5:
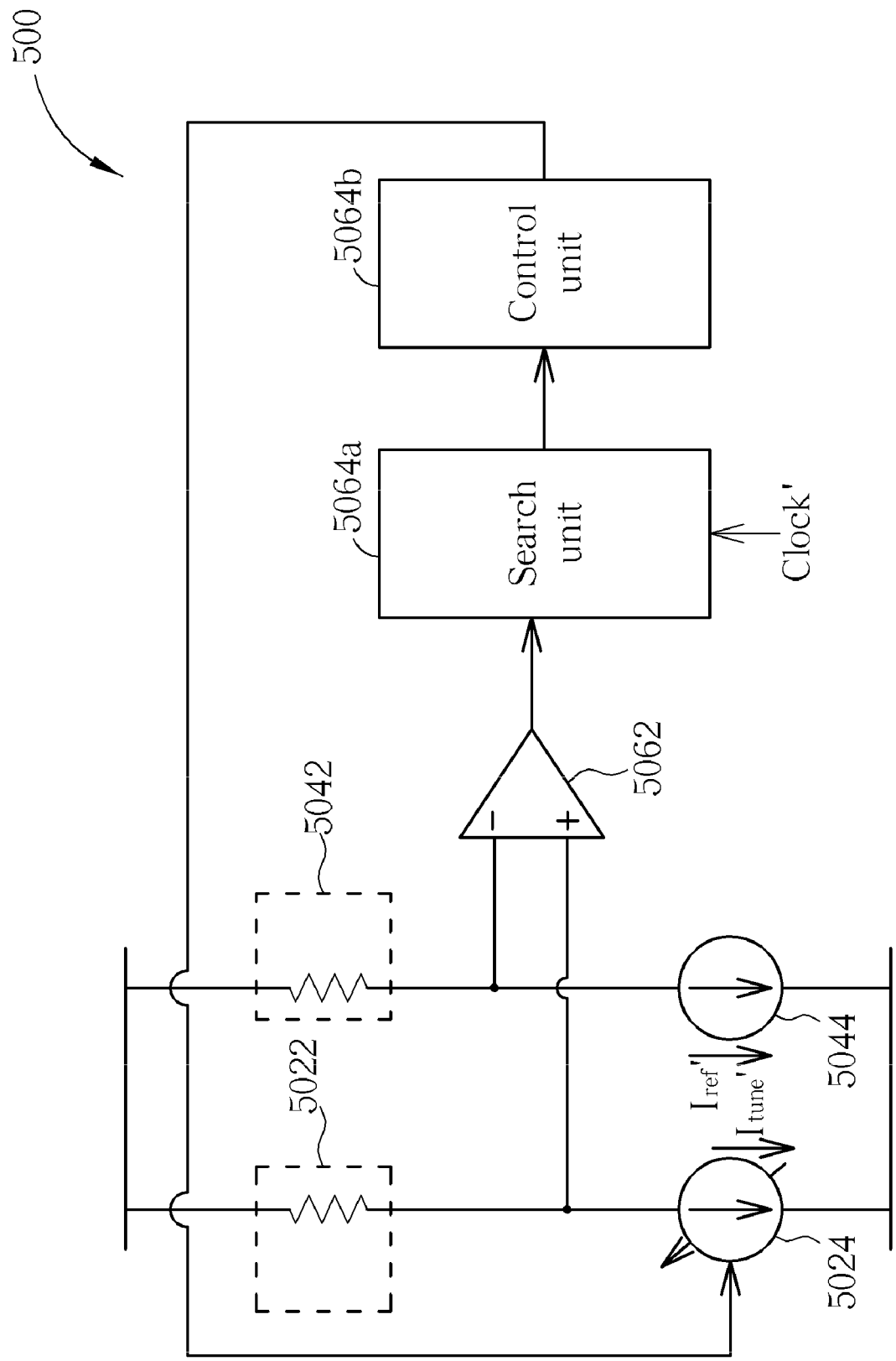
FIG. 5 is a diagram illustrating a calibration apparatus according to a fourth embodiment of the present invention.

A modification of the third embodiment calibration apparatus 400 is shown in FIG. 5. FIG. 5 is a diagram illustrating a calibration apparatus 500 according to a fourth embodiment of the present invention. The calibration apparatus 500 comprises a first circuit element 5022, a tunable current generator 5024, a second circuit element 5042, a reference current generator 5044, a comparator 5062, a search unit 5064a, and a control unit 5064b. Compared to the third embodiment calibration apparatus 400, the tunable current Itune' generated by the tunable current generator 5024 is sunk from the first circuit element 5022, and the reference current Iref' generated by the reference current generator 5044 is sunk from the second circuit element 5022. Since the operation of the calibration apparatus 500 is similar to the above-mentioned calibration apparatus 400, the detailed description is omitted here for brevity.

Figure 6:
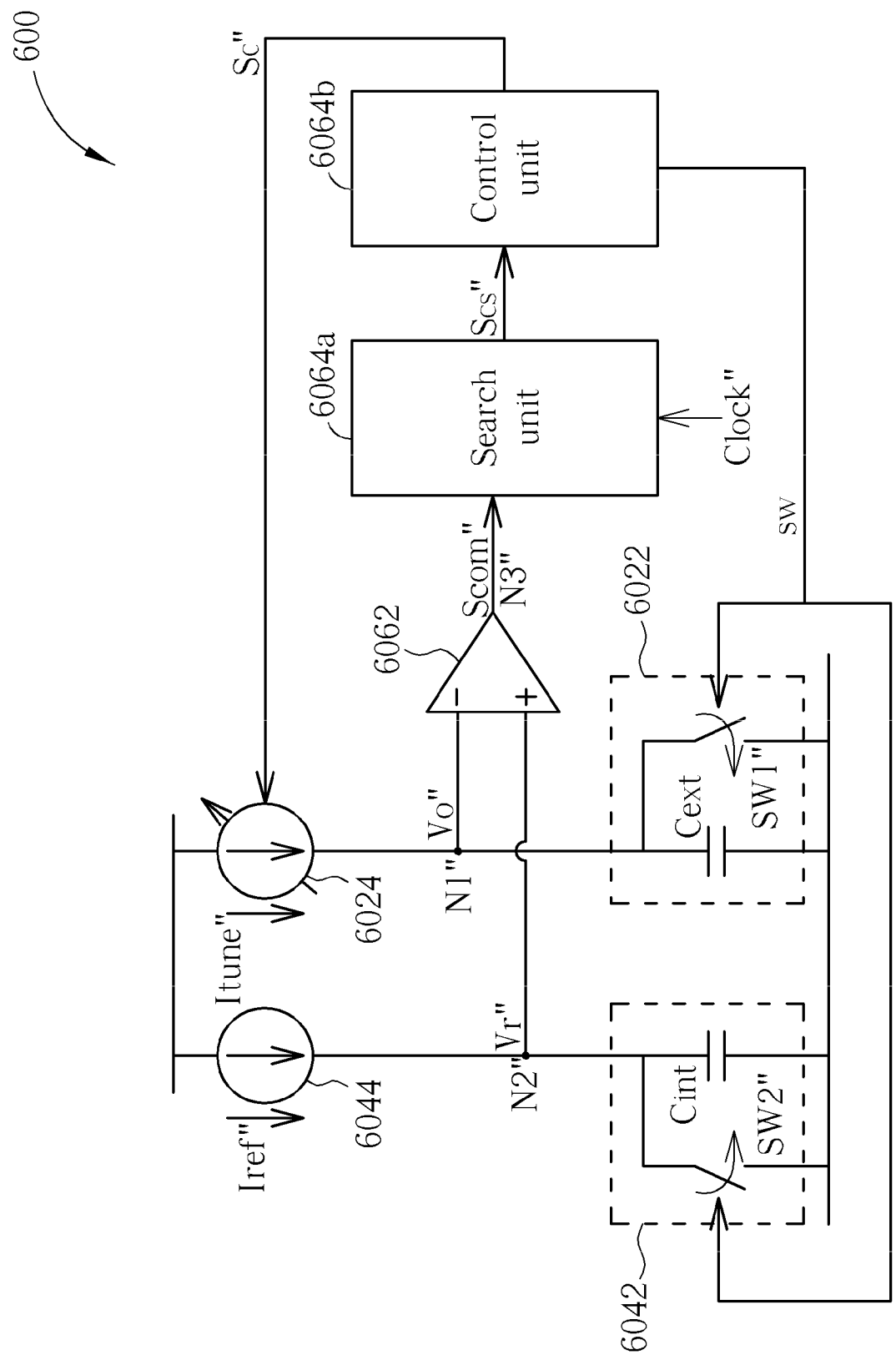
FIG. 6 is a diagram illustrating a calibration apparatus according to a fifth embodiment of the present invention.

Please refer to FIG. 6. FIG. 6 is a diagram illustrating a calibration apparatus 600 according to a fifth embodiment of the present invention. The calibration apparatus 600 comprises a first circuit element 6022, a tunable current generator 6024, a second circuit element 6042, a reference current generator 6044, a comparator 6062, a search unit 6064a, and a control unit 6064b. According to the embodiment of the present invention, the first circuit element 6022 comprises an external capacitor Cext and a switch SW1", wherein the external capacitor Cext has a capacitance of $c_{ext}$ and the external capacitor Cext is not disposed in an integrate circuit (IC). The second circuit element 6042 comprises an internal capacitor Cint and a switch SW2", wherein the internal capacitor Cint has a capacitance of $c_{int}$ disposed in the IC. The tunable current generator 6024 provides a tunable current Itune" to the external capacitor Cext to generate an output voltage Vo" when the switch SW1 is open (i.e., turn off). The reference current generator 6044 provides a reference current Iref" to the internal capacitor Cint to generate a reference voltage Vr". Similar to the first embodiment calibration apparatus 100, the comparator 6062 has a first input terminal (i.e., negative terminal (−)) coupled to the first node N1", a second input terminal (i.e., positive terminal (+)) coupled to the second node N2", and an output terminal N3", and the comparator 6062 is arranged for comparing the reference voltage Vr" and the output voltage Vo" to generate a comparison result Scom" at the output terminal N3". The search unit 6064a is coupled to the comparator 6062 for performing a binary search operation according to the comparison result Scom" to thereby determine a control setting Scs". In addition, a clock signal CLOCK" is coupled to the search unit 6064a. The control unit 6064b is coupled to the search unit 6064a for generating the control signal Sc" according to the control setting Scs" to adjust the tunable current Itune" to a target current value Itar". In addition, the tunable current generator 6024 adjusts the tunable current Itune" in response to the control signal Sc". In addition, the control unit 6064b generates a control signal sw to control the switches SW1", SW2".

Figure 7:
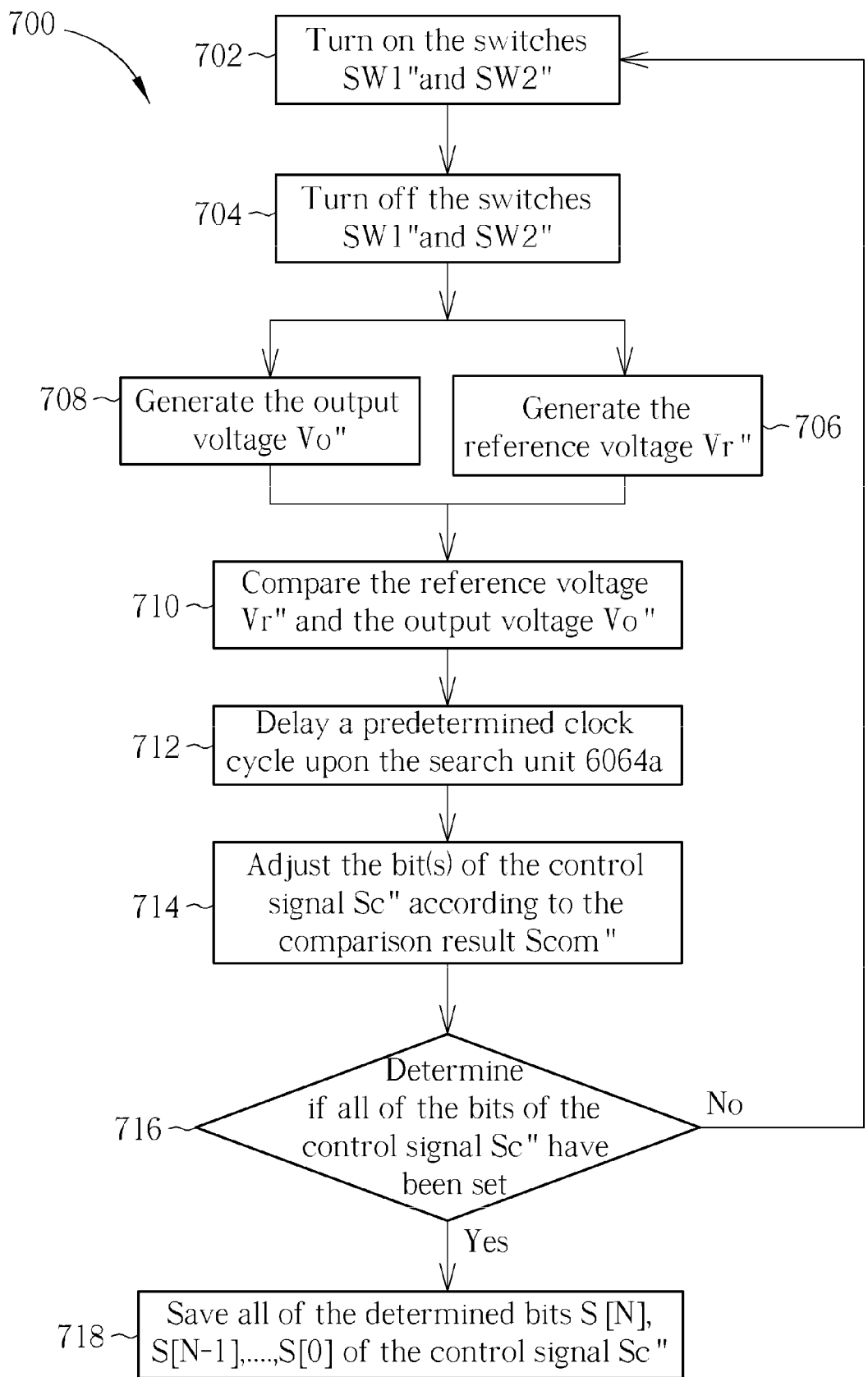
FIG. 7 is a flow chart illustrating the calibration method according to a sixth embodiment of the present invention.

Compared to the first embodiment calibration apparatus 100, the first circuit element 6022 comprises the external capacitor Cext and the switch SW1", and the second circuit element 6042 comprises the internal capacitor Cint and the switch SW2". Therefore, by applying the second embodiment calibration method 300 of the present invention, the electric charges remaining on the external capacitor Cext and the internal capacitor Cint will be discharged first. In other words, the calibration method 300 is modified to a calibration method 700 as shown in FIG. 7. FIG. 7 is a flow chart illustrating the calibration method 700 according to a sixth embodiment of the present invention. Provided that substantially the same result is achieved, the steps of the flowchart shown in FIG. 7 need not be in the exact order shown and need not be contiguous, that is, other steps can be intermediate.

The calibration method 700 comprises:
step 702: turn on the switches SW1" and SW2" to discharge the charges on the external capacitor Cext and the internal capacitor Cint, respectively;
step 704: turn off the switches SW1" and SW2", go to step 706 and step 708;
step 706: generate the reference current Iref" to charge the internal capacitor Cint to generate the reference voltage Vr", go to step 710;
step 708: generate the tunable current Itune" to charge the external capacitor Cext according to the control signal Sc" to generate the output voltage Vo", go to step 710;
step 710: compare the reference voltage Vr" and the output voltage Vo" to generate a comparison result Scom";
step 712: delay a predetermined clock cycle upon the search unit 6064a;
step 714: adjust the bit(s) of the control signal Sc" according to the comparison result Scom", e.g., in the beginning, set the most significant bit of the control signal Sc" into 1, i.e., S[N]=1, and the rest of the significant bits (less significant bits) as 0, i.e., S[N]=1, S[N-1]=0, . . . , S[0]=0, if the comparison result Scom" shows that the reference voltage Vr" is lower than the output voltage Vo", or set the most significant bit of the control signal Sc" into 0 and the rest of the significant bits as 0 if the reference voltage Vr" is higher than the output voltage Vo";

step 716: determine if all of the bits of the control signal Sc" have been set, if yes, go to step 718, if no, use the current-adjusted bits to set the control signal Sc" and go to step 702;

step 718: save all of the determined bits S[N], S[N-1], . . . , S[0] of the control signal Sc".

In step 714, the predetermined clock cycle can be viewed as a time interval Tp. Therefore, when the output voltage Vo" is equal to the reference voltage Vr":

$$(V_{bg}''/r_{int}'')*(1/c_{int})*Tp=(V_{bg}''/r_{int}'')*(1/c_{ext})*M''*Tp,$$

$$c_{int}=c_{ext}/M''. \quad (5)$$

According to the equation (5), when the output voltage Vo" is equal to the reference voltage Vr", the capacitance Cint of the internal capacitor Cint is equal to M" times smaller than the capacitance Cext of the external capacitor Cext, and the target current value Itar" is equal to $(V_{bg}''/r_{int}'')*M''$, wherein $r_{int}''$ is the resistance of the internal resistor $R_{int}''$ coupled to the output voltage $V_{bg}''$ of a bandgap reference circuit. In other words, no matter how serious the process variation that occurs to the internal capacitor Cint, the capacitance $c_{int}$ of the internal capacitor Cint can be obtained since the integer number M" and the capacitance $c_{ext}$ of the external capacitor Cext are known values. Then, a further calibration upon the internal capacitor Cint can be proceed. The detailed description is omitted here for brevity.

Figure 8:
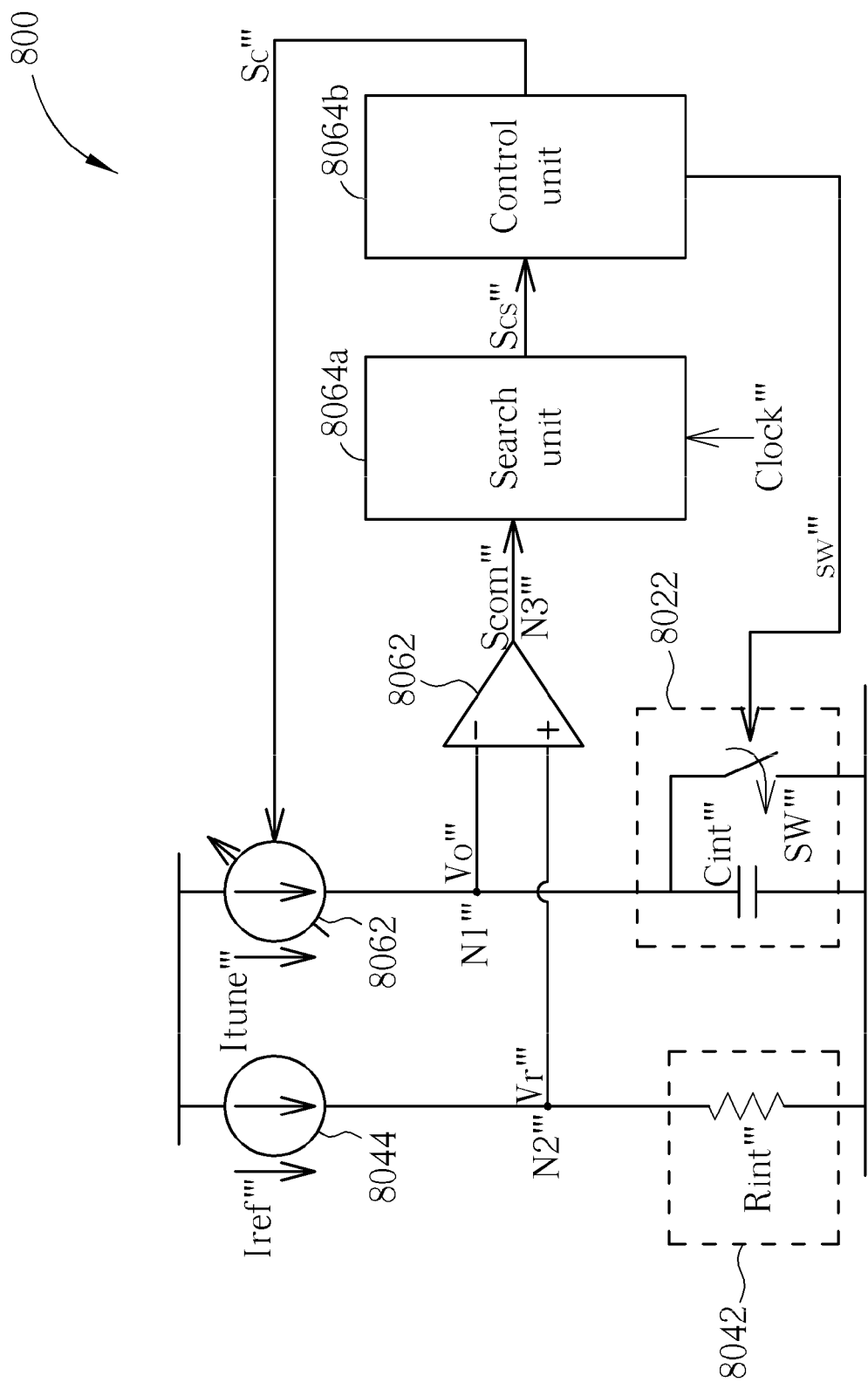
FIG. 8 is a diagram illustrating a calibration apparatus according to a seventh embodiment of the present invention.

Please refer to FIG. 8. FIG. 8 is a diagram illustrating a calibration apparatus 800 according to a seventh embodiment of the present invention. The calibration apparatus 800 comprises a first circuit element 8022, a tunable current generator 8024, a second circuit element 8042, a reference current generator 8044, a comparator 8062, a search unit 8064a, and a control unit 8064b. According to the embodiment of the present invention, the first circuit element 8022 comprises an internal capacitor Cint''' and a switch SW''', wherein the internal capacitor Cint''' has a capacitance of $c_{int}'''$ and the internal capacitor Cint''' is disposed in an integrated circuit (IC). The second circuit element 8042 comprises an internal resistor Rint''', wherein the internal resistor Rint''' has a resistance of $r_{int}'''$ disposed in the IC. The tunable current generator 8024 provides a tunable current Itune''' to the internal capacitor Cint''' to generate an output voltage Vo''' when the switch SW''' is open (i.e., turned off). The reference current generator 8044 provides a reference current Iref''' to the internal resistor Rint''' to generate a reference voltage Vr'''. Similar to the first embodiment calibration apparatus 100, the comparator 8062 has a first input terminal (i.e., negative terminal (−)) coupled to the first node N1''', a second input terminal (i.e., positive terminal (+)) coupled to the second node N2''', and an output terminal N3''', and the comparator 8062 is arranged for comparing the reference voltage Vr''' and the output voltage Vo''' to generate a comparison result Scom''' at the output terminal N3'''. The search unit 8064a is coupled to the comparator 8062 for performing a binary search operation according to the comparison result Scom''' to thereby determine a control setting Scs'''. In addition, a clock signal CLOCK''' is coupled to the search unit 8064a. The control unit 8064b is coupled to the search unit 8064a for generating the control signal Sc''' according to the control setting Scs''' to adjust the tunable current Itune''' to a target current value Itar'''. In addition, the tunable current generator 8024 adjusts the tunable current Itune''' in response to the control signal Sc'''. In addition, the control unit 8064b generates a control signal sw''' to control the switch SW'''.

Figure 9:
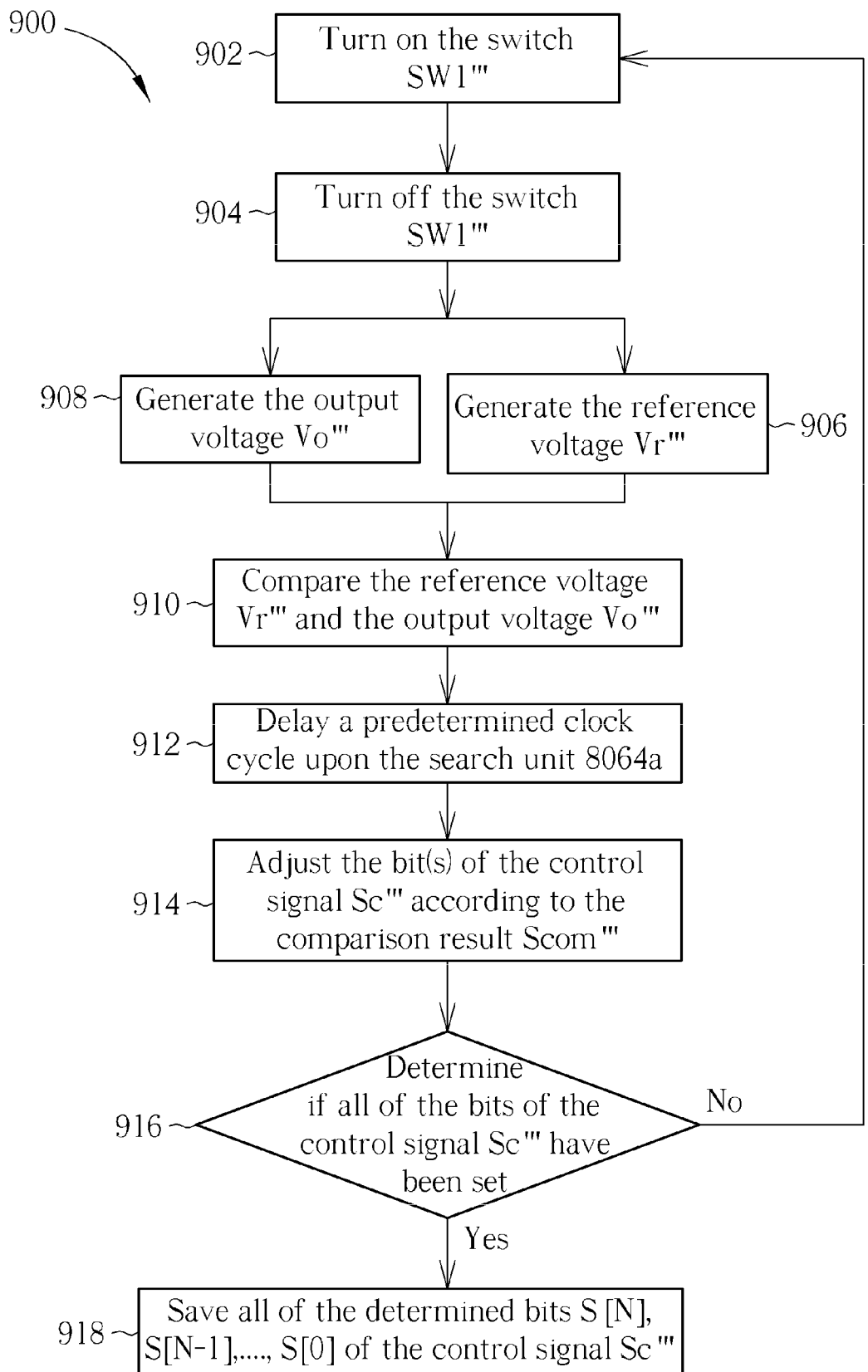
FIG. 9 is a flow chart illustrating the calibration method according to an eighth embodiment of the present invention.

Compared to the first embodiment calibration apparatus 100, the first circuit element 8022 comprises the internal capacitor Cint''' and the switch SW'''. Therefore, by applying the second embodiment calibration method 300 of the present invention, the electric charges remained on the internal capacitor Cint''' should be discharged first. In other words, the calibration method 300 is modified to a calibration method 800 as shown in FIG. 9. FIG. 9 is a flow chart illustrating the calibration method 900 according to an eighth embodiment of the present invention. Provided that substantially the same result is achieved, the steps of the flowchart shown in FIG. 9 need not be in the exact order shown and need not be contiguous, that is, other steps can be intermediate.

The calibration method 900 comprises:

step 902: turn on the switch SW''' to discharge the charges on the internal capacitor Cint''';

step 904: turn off the switch SW'''.

step 906: generate the reference current Iref''' to the internal resistor Rint''' to generate the reference voltage Vr''', go to step 910;

step 908: generate the tunable current Itune''' to charge the internal capacitor Cint''' according to the control signal Sc''' to generate the output voltage Vo''', go to step 910;

step 910: compare the reference voltage Vr''' and the output voltage Vo''' to generate a comparison result Scom''';

step 912: delay a predetermined clock cycle upon the search unit 8064a;

step 914: adjust the bit(s) of the control signal Sc''' according to the comparison result Scom''', e.g., in the beginning, set the most significant bit of the control signal Sc''' into 1, i.e., S[N]=1, and the rest of the significant bits (less significant bits) as 0, i.e., S[N]=1, S[N-1]=0, . . . , S[0]=0, if the comparison result Scom'''shows that the reference voltage Vr''' is lower than the output voltage Vo''', or set the most significant bit of the control signal Sc''' into 0 and the rest of the significant bits as 0 if the reference voltage Vr''' is higher than the output voltage Vo''';

step 916: determine if all of the bits of the control signal Sc''' have been set, if yes, go to step 918, if no, use the current-adjusted bits to set the control signal Sc''' and go to step 902;

step 918: save all of the determined bits S[N], S[N-1], . . . , S[0] of the control signal Sc'''.

In step 912, the predetermined clock cycle can be viewed as a time interval Tp'''. Therefore, when the output voltage Vo''' is equal to the reference voltage Vr''':

$$(V_{bg}'''/r_{int}''')*\alpha*r_{int}'''=(V_{bg}'''/r_{int}''')*(1/c_{int}''')*M'''*Tp''',$$

$$\alpha=(1/(r_{int}'''*c_{int}'''))*M'''*Tp''',$$

wherein α=1. Therefore, $$r_{int}'''*c_{int}'''=M'''*Tp'''. \quad (6)$$

According to the equation (6), when the output voltage Vo''' is equal to the reference voltage Vr''', the time constant generated by the capacitance $c_{int}'''$ of the internal capacitor Cint''' and the resistance $r_{int}'''$ of the internal resistor Rint''' is equal to M''' times the time interval Tp''', and the target current value Itar''' is equal to $(V_{bg}'''/r_{int}''')*M'''$, wherein $r_{int}'''$ is the resistance of the internal resistor Rint''' coupled to the output voltage $V_{bg}'''$ of a bandgap reference circuit. In other words, no matter how serious the process variation that occurs to the internal capacitor Cint''' and the internal resistor Rint''', the time constant generated by the internal capacitor Cint''' and the internal resistor Rint''' can be obtained since the integer number M''' and the time interval Tp''' are known values. Then, a further calibration upon the internal capacitor Cint''' and the internal resistor Rint''' can be proceed. The detailed description is omitted here for brevity.

In conclusion, by applying the above-mentioned calibration apparatuses and the calibration methods, the deviation caused by the process variation of the passive elements in an integrated circuit, such as an internal resistor and an internal capacitor, can be obtained and calibrated effectively.

Those skilled in the art will readily observe that numerous modifications and alterations of the device and method may be made while retaining the teachings of the invention.

What is claimed is:

1. A calibration apparatus, comprising:
    a first circuit, arranged for generating a reference voltage with respect to a first circuit element according to a reference current flowing to the first circuit element;
    a second circuit, arranged for generating an output voltage according to a tunable current; and
    an adjusting circuit, coupled to the first circuit and the second circuit, for adjusting the tunable current to a target current value according to the reference voltage and the output voltage, wherein the adjusting circuit comprises:
        a search unit, for performing a binary search according to a comparison result of the reference voltage and the output voltage to thereby determine a control setting; and
        a control unit, coupled to the search unit, for generating a control signal to the second circuit according to the control setting, wherein the search unit operates according to a clock signal, and after the search unit adjusts the control setting, the search unit stops adjusting the control setting according to the comparison result for a predetermined number of clock cycles of the clock signal.

2. The calibration apparatus of claim 1, wherein the reference current is a constant current or a current proportional to absolute temperature (PTAT).

3. The calibration apparatus of claim 1, wherein the first circuit comprises:
    the first circuit element; and
    a reference current generator, coupled to the first circuit element at a first node, for generating the reference current to the first circuit element, thereby inducing the reference voltage at the first node that is further coupled to the adjusting circuit;
    the second circuit comprises:
    a second circuit element; and
    a tunable current generator, coupled to the second circuit element at a second node, the tunable current generator for generating the tunable current to the second circuit element according to a control signal generated from the adjusting circuit, thereby inducing the output voltage at the second node that is further coupled to the adjusting circuit.

4. The calibration apparatus of claim 3, wherein the first circuit element is an internal resistor disposed in an integrated circuit, and the second circuit element is an external resistor not disposed in the integrated circuit.

5. The calibration apparatus of claim 3, wherein the second circuit element is an internal resistor disposed in an integrated circuit, and the first circuit element is an external resistor not disposed in the integrated circuit.

6. The calibration apparatus of claim 3, wherein the first circuit element is an internal capacitor disposed in an integrated circuit, the second circuit element is an external capacitor not disposed in the integrated circuit, the first circuit further comprises a first switch coupled to the first circuit element in parallel; the second circuit further comprises a second switch coupled to the second circuit element in parallel; and the adjusting circuit is arranged to switch on the first and second switches to discharge the first and second circuit elements each time the adjusting circuit adjusts the tunable current.

7. The calibration apparatus of claim 3, wherein one of the first and second circuit elements is a resistor, and the other of the first and second circuit elements is a capacitor.

8. The calibration apparatus of claim 3, wherein the first circuit element is an internal resistor disposed in an integrated circuit, the second circuit element is an internal capacitor disposed in the integrated circuit, the second circuit further comprises a switch coupled to the second circuit element in parallel; and the adjusting circuit is arranged to switch on the switch to discharge the second circuit element each time the adjusting circuit adjusts the tunable current.

9. The calibration apparatus of claim 1, wherein the adjusting circuit further comprises:
    a comparator arranged for comparing the reference voltage and the output voltage to generate the comparison result; wherein the second circuit is arranged to adjust the tunable current in response to the control signal.

10. The calibration apparatus of claim 3, wherein the tunable current generator comprises:
    a reference current source, for generating the reference current;
    a diode-connected transistor, having a connecting terminal coupled to the reference current source;
    a plurality of mirroring transistors, arranged to mirror the reference current to generating a plurality of mirroring currents, respectively; and
    a plurality of switches, respectively coupled between a plurality of control terminals of the plurality of mirroring transistors and a control terminal of the diode-connected transistor, wherein each of the plurality of switches is controlled by the control signal to selectively enable a corresponding mirroring transistor to generate a mirroring current to an output node of the tunable current generator.

11. A calibration method, comprising:
    generating a reference voltage with respect to a first circuit element according to a reference current flowing to the first circuit element;
    generating an output voltage according to a tunable current; and
    adjusting the tunable current to a target current value according to the reference voltage and the output voltage, comprising:
        performing a binary search according to a comparison result of the reference voltage and the output voltage to thereby determine a control setting; and
        generating a control signal to control the tunable current according to the control setting, wherein the binary search is operated according to a clock signal, and after the control setting is adjusted, the control setting is stop adjusted according to the comparison result for a predetermined number of clock cycles of the clock signal.

12. The calibration method of claim 11, wherein the reference current is a constant current or a current proportional to absolute temperature.

13. The calibration method of claim 11, further comprising:
    flowing the tunable current to a second circuit element for generating the output voltage.

14. The calibration method of claim 13, wherein the first circuit element is an internal resistor disposed in an integrated circuit, and the second circuit element is an external resistor not disposed in the integrated circuit.

15. The calibration method of claim 13, wherein the second circuit element is an internal resistor disposed in an integrated circuit, and the first circuit element is an external resistor not disposed in the integrated circuit.

16. The calibration method of claim 13, wherein the first circuit element is an internal capacitor disposed in an integrated circuit, the second circuit element is an external capacitor not disposed in the integrated circuit.

17. The calibration method of claim 13, wherein one of the first and second circuit elements is a resistor, and the other of the first and second circuit elements is a capacitor.

18. The calibration method of claim 13, wherein the first circuit element is an internal resistor disposed in an integrated circuit, the second circuit element is an internal capacitor disposed in the integrated circuit.

* * * * *